United States Patent
Kwon et al.

(10) Patent No.: US 8,337,618 B2
(45) Date of Patent: Dec. 25, 2012

(54) SILICON CRYSTALLIZATION SYSTEM AND SILICON CRYSTALLIZATION METHOD USING LASER

(75) Inventors: Oh-Seob Kwon, Yongin (KR); Sang-Jo Lee, Yongin (KR); Hong-Ro Lee, Yongin (KR); Je-Kil Ryu, Yongin (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 0 days.

(21) Appl. No.: 12/911,937

(22) Filed: Oct. 26, 2010

(65) Prior Publication Data

US 2011/0097906 A1    Apr. 28, 2011

(30) Foreign Application Priority Data

Oct. 26, 2009   (KR) .................... 10-2009-0101813
Jun. 18, 2010   (KR) .................... 10-2010-0058150

(51) Int. Cl.
*C30B 28/12* (2006.01)

(52) U.S. Cl. .......................... 117/200; 117/4

(58) Field of Classification Search ............ 438/795, 438/708, 760, 166, 272, 486, 487, 472, 120; 257/72
See application file for complete search history.

(56) References Cited

U.S. PATENT DOCUMENTS

| | | | |
|---|---|---|---|
| 5,266,532 A * | 11/1993 | Russell et al. | 438/708 |
| 7,335,260 B2 * | 2/2008 | Jung | 117/200 |
| 7,723,169 B2 | 5/2010 | Graefe et al. | |
| 2003/0153167 A1 * | 8/2003 | Ohnuma et al. | 438/487 |
| 2006/0131587 A1 * | 6/2006 | Sato et al. | 257/72 |

FOREIGN PATENT DOCUMENTS

| | | |
|---|---|---|
| JP | 09-260684 A | 10/1997 |
| JP | 2000-208415 A | 7/2000 |
| JP | 2004-349415 | 12/2004 |
| JP | 2006-287183 | 10/2006 |
| JP | 2008-016745 | 1/2008 |
| JP | 2009-527925 | 7/2009 |
| KR | 10-2005-0064367 A | 6/2005 |
| KR | 10 2005-0121549 A | 12/2005 |
| KR | 10 2007-0096088 A | 10/2007 |
| KR | 10-0766936 B1 | 10/2007 |

* cited by examiner

*Primary Examiner* — Olik Chaudhuri
*Assistant Examiner* — Wilner Jean Baptiste
(74) *Attorney, Agent, or Firm* — Lee & Morse, P.C.

(57) ABSTRACT

A silicon crystallization system includes a vibration device for vibrating a linear laser beam along a longer-axis direction of the linear laser beam. A vibration frequency at which the laser beam is vibrated is periodically generated and randomly changes within a predetermined range.

29 Claims, 15 Drawing Sheets

SILICON CRYSTALLIZATION SYSTEM AND SILICON CRYSTALLIZATION METHOD USING LASER

BACKGROUND

1. Field

The described technology relates generally to a silicon crystallization system and a silicon crystallization method using a laser, and more particularly, to a silicon crystallization system and a silicon crystallization method that are capable of improving energy uniformity in a longer-axis direction of a laser beam.

2. Description of the Related Art

A liquid crystal display (LCD) and an organic light emitting diode (OLED) display, which are types of flat panel display devices, can be fabricated to be thin and light, so they are commonly used as a display device for mobile electronic devices, and their application coverage is extending to large-scale display devices. In particular, as the necessity for a display device requiring high speed operational characteristics emerges, research for such a display device is actively ongoing.

In order to satisfy the high speed operational characteristics of a display device, a channel region of a thin film transistor (TFT) must be formed by using polycrystalline silicon instead of amorphous silicon that has electrical mobility of about 0.1 $cm^2$/Vsec to 0.2 $cm^2$/Vsec. Polycrystalline silicon has electrical mobility of about 20 $cm^2$/Vsec to 150 $cm^2$/Vsec, thereby implementing a faster operational speed compared with amorphous silicon.

An annealing method using a laser is one of conventional methods for forming polycrystalline silicon. The annealing method involves irradiating a high energy laser beam onto an amorphous silicon thin film deposited on a glass substrate. Upon receiving the laser beam, the amorphous silicon thin film is melted by the heat and then solidified so as to be crystallized. This method is advantageous in that the glass substrate is not damaged by the heat.

In the laser crystallization method, an energy distribution of an output laser beam, which generally has a Gaussian distribution, is changed by using an optical system. That is, in order to enhance uniformity and productivity of crystallization, the output laser beam is transformed into a linear laser beam, which is longer in one direction.

In order to create the linear laser beam by changing the energy distribution of the output laser beam, a homogenizer is employed. An optical system using the homogenizer serves to divide a laser beam in particular directions by a homogenizer array and make the respective divided layer beams overlap on the same plane, to thereby make the energy distribution of the laser beam more uniform.

In this respect, however, compared with a case where the divided laser beams overlap in an area that is narrower than the initial laser beam, when the laser beams overlap in an area that is larger than the initial laser beam, the energy uniformity of the laser beam is low due to factors such as the optical characteristics of the laser, a defect of the optical system, and the like.

In addition, as flat panel display devices increase in size, the length of the laser beam in the longer-axis direction needs to be longer to enhance productivity of the flat panel display devices. This inevitably results in degradation of the energy uniformity in the longer-axis direction of the laser beam.

The above information disclosed in this Background section is only for enhancement of understanding of the background of the described technology and therefore it may contain information that does not form the prior art that is already known in this country to a person of ordinary skill in the art.

SUMMARY

Embodiments are therefore directed to a silicon crystallization system and a silicon crystallization method, which substantially overcome one or more of the problems due to the limitations and disadvantages of the related art.

It is therefore a feature of an embodiment to provide a silicon crystallization system and a silicon crystallization method having improved polycrystalline silicon and display quality of a display device using the polycrystalline silicon by reducing energy non-uniformity in a longer-axis direction of a linear laser beam used in crystallizing silicon.

It is another feature of an embodiment to provide silicon crystallization system and a silicon crystallization method that reduces formation of stripe pattern blurs on the polycrystalline silicon thin film according to the vibration of the laser beam.

It is yet another feature of an embodiment to provide silicon crystallization system and a silicon crystallization method in which a vibration frequency at which the laser beam vibrates distributed, e.g., uniformly or Gaussian, within a certain variation width and randomly generated for each laser beam pulse.

It is yet another feature of an embodiment to provide silicon crystallization system and a silicon crystallization method in which a vibration frequency is generated that is not too close to a previously generated frequency.

It is yet another feature of an embodiment to provide a silicon crystallization system and a silicon crystallization method in which a random vibration frequency is previously generated and used in a crystallization process, thus restraining delay in data input and output and preventing instability of the system.

At least one of the above and other features and advantages may be realized by providing a silicon crystallization system including a vibration device configured to vibrate a linear laser beam in a longer-axis direction of the linear laser beam, the vibration device being configured to periodically generate and randomly change a vibration frequency, within a predetermined range, at which the laser beam is vibrated.

The generation period of the vibration frequency may be the same as a pulse period of the laser beam.

The generation period of the vibration frequency may be longer than the pulse period of the laser beam.

A newly generated vibration frequency may not be the same as an immediately previous vibration frequency that has already been generated.

The difference between the newly generated vibration frequency and the immediately previous vibration frequency may be greater than a predetermined minimum, e.g., 2 Hz.

The distribution of the vibration frequency may be uniform or Gaussian.

The silicon crystallization system may further include an optical system including a mirror that changes the energy distribution of the laser beam and the path of the laser beam.

The vibration device may vibrate the mirror.

The optical system may include a homogenizer array for forming the linear shape of the laser beam, and a plurality of lens groups.

The vibration device may include a vibration operator reciprocally moving an end of the mirror, a controller including a driver for driving the vibration operator, a pulse generator generating a drive signal of the vibration operator, and a vibration frequency controller generating a vibration frequency of the drive signal.

The vibration frequency controller may randomly modulate the amplitude of the drive signal.

In a silicon crystallization system according to another exemplary embodiment of the present invention, the vibration frequency may be previously set as a single vibration frequency set having a plurality of values that change randomly.

The number of vibration frequencies included in the preset vibration frequency set may be $$\frac{\text{Cell width}}{\text{Scan interval of laser beam}}$$

or smaller.

The number of vibration frequencies included in the preset vibration frequency set may be $$\frac{\text{Width of mother substrate}}{\text{Scan interval of laser beam}}$$

or smaller.

The number of vibration frequencies included in the preset vibration frequency set may be $$\frac{(\text{Number of mother substrates included in one lot}) \times (\text{Width of mother substrate})}{\text{Scan interval of laser beam}}$$

or smaller.

A silicon crystallization system according to another exemplary embodiment of the present invention may further include an optical system, and the optical system may change energy distribution of the laser beam, change the path of the laser beam, and include a mirror for changing the path of the laser beam.

The vibration device may vibrate the mirror.

The optical system may include a homogenizer array for forming a linear shape of the laser beam, and a plurality of lens groups.

The vibration device may include: a vibration operator reciprocally moving the end of the mirror, a controller including a driver for driving the vibration operator, a pulse generator generating a drive signal of the vibration operator, and a vibration frequency storage unit storing a vibration frequency of the drive signal.

In the vibration frequency storage unit, the amplitude of the drive signal may be previously set as a randomly changing value.

Another embodiment provides a silicon crystallization method including: preparing a substrate with an amorphous silicon thin film formed thereon; and irradiating a linear laser beam to the amorphous silicon thin film by using an optical system to form polycrystalline silicon, irradiating including vibrating the laser beam in a longer-axis direction at a vibration frequency that is periodically generated and randomly changed within a predetermined range.

The generation period of the vibration frequency may be the same as a pulse period of the laser beam.

The generation period of the vibration frequency may be longer than the pulse period of the laser beam.

A newly generated vibration frequency may not be the same as an immediately previous vibration frequency that has been already generated.

The difference between the newly generated vibration frequency and the immediately previous vibration frequency may be greater than a predetermined minimum, e.g., 2 Hz.

The vibration frequency may be uniform or Gaussian.

The silicon crystallization method may further include forming the linear shape of the laser beam by the optical system.

In a silicon crystallization system according to another exemplary embodiment of the present invention, the vibration frequency may be previously set as a single vibration frequency set having a plurality of values that change randomly and are stored in the vibration frequency storage unit, and the vibration frequency storage unit may transfer the vibration frequency to the optical system.

The number of vibration frequencies included in the preset vibration frequency set may be $$\frac{\text{Cell width}}{\text{Scan interval of laser beam}}$$

or smaller.

The number of vibration frequencies included in the preset vibration frequency set may be $$\frac{\text{Width of mother substrate}}{\text{Scan interval of laser beam}}$$

or smaller.

The number of vibration frequencies included in the preset vibration frequency set may be $$\frac{(\text{Number of mother substrates included in one lot}) \times (\text{Width of mother substrate})}{\text{Scan interval of laser beam}}$$

or smaller.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Korean Patent Application No. 10-2009-0101813, filed on Oct. 26, 2010, and Korean Patent Application No. 10-2010-0058150, filed on Jun. 18, 2010, in the Korean Intellectual Property Office, and entitled: "Silicon Crystallization System and Silicon Crystallization Method Using Laser," are incorporated by reference herein in their entirety.

Embodiments will be described more fully hereinafter with reference to the accompanying drawings, in which exemplary embodiments of the invention are shown. As those skilled in the art would realize, the described embodiments may be modified in various different ways, all without departing from the spirit or scope of the present invention.

First, a silicon crystallization system and a method of generating a vibration frequency of a laser beam according to an exemplary embodiment will be described with reference to FIGS. 1 and 2.

Figure 1:
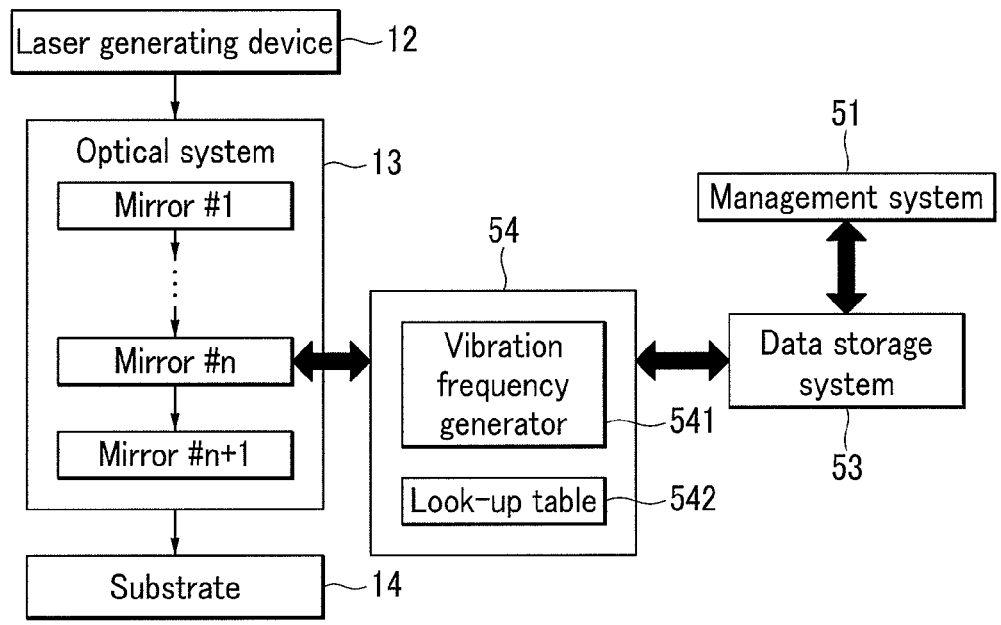
FIG. 1 illustrates a schematic block diagram of a silicon crystallization system according to an exemplary embodiment.
Figure 2:
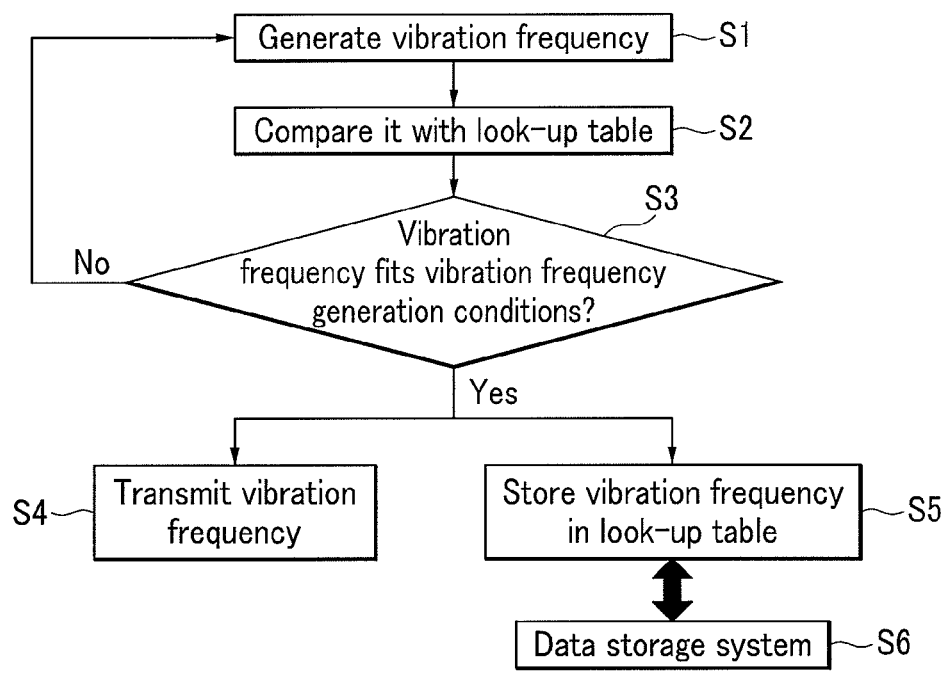
FIG. 2 illustrates a flow chart of a process of generating a vibration frequency of a laser beam according to an exemplary embodiment.

FIG. 1 illustrates a schematic block diagram of a silicon crystallization system according to an exemplary embodiment. FIG. 2 illustrates a flow chart of a process of generating a vibration frequency of a laser beam according to an exemplary embodiment.

With reference to FIG. 1, the silicon crystallization system according to the present exemplary embodiment may include a laser generating device 12 that generates a laser beam, an optical system 13, a substrate 14, a vibration frequency controller 54, a data storage system 53, and a management system 51.

The optical system 13, including a plurality of mirrors #1, . . . , #n+1, transforms an energy distribution and direction of the oscillated laser beam to scan the same to the substrate 14.

The vibration frequency controller 54 controls a vibration frequency for vibrating at least one of the mirrors of the optical system 13. The vibration frequency controller 54 may include a vibration frequency generator 541 that generates a vibration frequency under certain vibration frequency generation conditions and a look-up table 542 that stores the generated vibration frequency.

The data storage system 53 may store the vibration frequency that has been generated by the vibration frequency generator 541. The management system 51 may monitor the generated vibration frequency.

A method of generating a vibration frequency of a laser beam will now be described with reference to FIGS. 1 and 2.

The vibration frequency generator 541 of the vibration frequency controller 54 generates a vibration frequency of a laser beam under certain conditions (to be described) (S1). The, the vibration frequency controller 54 compares the generated vibration frequency with generation conditions stored in the look-up table 542 (S2) to determine whether or not the vibration frequency has been generated properly according to the vibration frequency generation conditions (S3). In this case, the vibration frequency is generated according to certain conditions, and this will be described later. If the vibration frequency of the laser beam generated from the vibration frequency controller 54 fits the vibration frequency generation conditions stored in the look-up table 542 (Y), the vibration frequency controller 54 may transmit the generated vibration frequency to the optical system 13 or to a pulse generator (not shown in FIG. 1, to be described later) (S4), and at the same time, store the same in the look-up table 542 (S5). If the vibration frequency of the generated laser beam does not fit the vibration frequency generation conditions stored in the look-up table 542 (N), the vibration frequency controller 54 may perform the process again, starting from generating the vibration frequency generation (S1).

The vibration frequency stored in the look-up table 542 may be stored in the data storage system 53 (S6) and transmitted to the management system 51.

The configuration of a silicon crystallization system according to an exemplary embodiment will now be described in more detail with reference to FIGS. 3 to 5.

Figure 3:
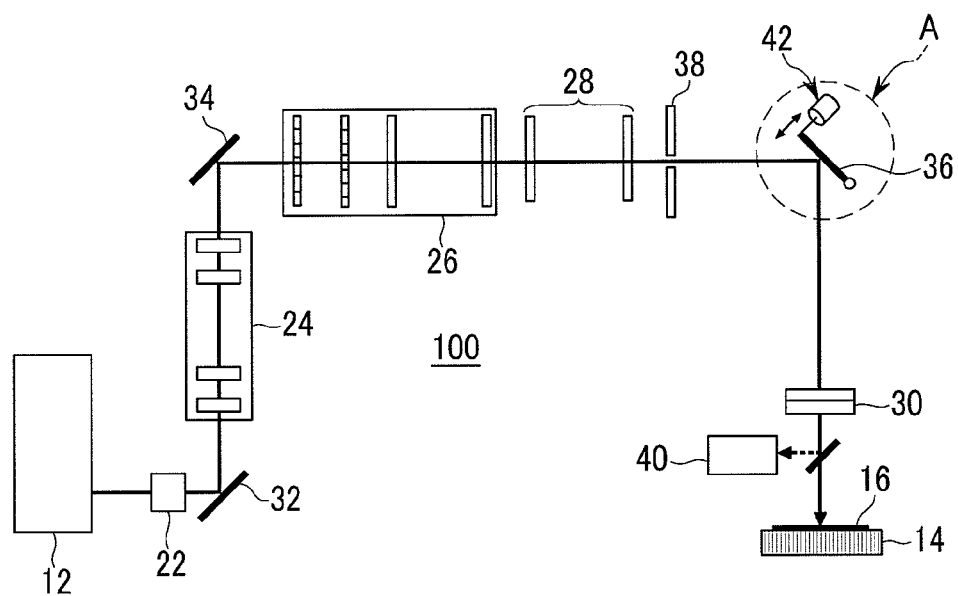
FIG. 3 illustrates a schematic diagram of a silicon crystallization system according to an exemplary embodiment.

FIG. 3 illustrates a schematic diagram of a silicon crystallization system according to an exemplary embodiment. FIG. 4 illustrates a schematic diagram of a substrate on which a laser beam is irradiated from the silicon crystallization system illustrated in FIG. 3, and a transfer stage supporting the substrate. FIG. 5 illustrates an enlarged view of a portion "A" in FIG. 3. The same reference numerals are used for the same elements as those in the above-described exemplary embodiment described above, and a description thereof will not be repeated.

With reference to FIG. 3, the silicon crystallization system 100 according to the present exemplary embodiment may include the laser generating device 12 and an optical system. The laser generating device 12 generates a laser beam. T optical system changes energy distribution of the laser beam output by the laser generating device 12 into a linear laser beam and scans the linear laser beam onto an amorphous silicon thin film 16 formed on the substrate 14.

Before describing the configuration of the optical system, a silicon crystallization process using a linear laser beam will be described briefly with reference to FIG. 4.

Figure 4:
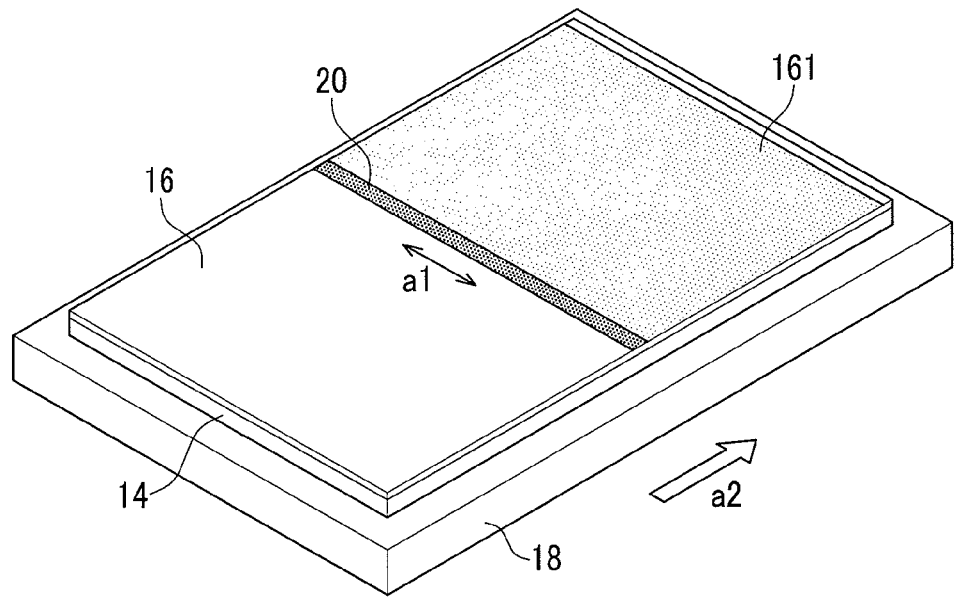
FIG. 4 illustrates a schematic diagram showing a substrate on which a laser beam is irradiated from the silicon crystallization system illustrated in FIG. 3, and a transfer stage supporting the substrate.

With reference to FIG. 4, the substrate 14 with the amorphous silicon thin film 16 formed thereon is mounted on a transfer stage 18. A laser beam 20, which has been transformed into a linear shape through the optical system 13, is incident on the amorphous silicon thin film 16, and a longer-axis direction of the laser beam 20 incident on the amorphous silicon thin film 16 is indicated by an arrow a1.

The laser beam 20 and the transfer stage 18 are moved relative to one another in the direction of an arrow a2, i.e., a direction orthogonal to the longer-axis direction of the laser beam 20, in order to scan the laser beam across an entirety of the substrate 14. For example, the position of the laser beam 20 may be fixed and the transfer stage 18 may be moved in the direction of the arrow a2. When the transfer stage 18 is moved, the laser beam 20 is irradiated to scan the amorphous silicon thin film 16 in an opposite direction of the direction of a2. Then, the amorphous silicon of a region 161 on which the laser beam 20 has been irradiated is melted and solidified so as to be changed into polycrystalline silicon.

In this process, ideally, the laser beam 20 incident on the amorphous silicon thin film 16 has a uniform energy distribution along the longer-axis direction a1. In practice, the laser beam 20 has a non-uniform energy distribution due to the characteristics of the optical system 13.

In the silicon crystallization system 100 according to the present exemplary embodiment, the mirrors #1 to #n+1 provided in the optical system 13 are vibrated non-periodically to allow the laser beam 20 to move with a certain amplitude along the longer-axis direction a1. Such movement of the laser beam 20 disperses the non-uniform energy distribution of the laser beam 20 toward a uniform energy distribution.

Referring again to FIG. 3, in the silicon crystallization system 100 according to the present exemplary embodiment, the optical system 13 may include an energy attenuator 22, a telescope lens unit 24, a homogenizer array 26, a first lens group 28, and a second lens group 30, which are sequentially positioned starting from the laser generating device 12.

The homogenizer array 26 divides an output laser beam generally having a Gaussian distribution into a plurality of laser beams along one direction. The first lens group 28 and the second lens group 30 make the plurality of laser beams that have been divided by the homogenizer array 26 overlap to form the linear laser beam 20 to be longer along the longer-axis direction a1.

The optical system 13, including at least one mirror according to the overall size of the silicon crystallization system 100 and a required laser beam path, changes the laser beam path. In FIG. 3, as an example, a first mirror 32 is positioned between the energy attenuator 22 and the telescope lens unit 24, a second mirror 34 is positioned between the telescope lens unit 24 and the homogenizer array 26, and a third mirror 36 is positioned between the first lens group 28 and the second lens group 30. The number and position of the mirrors are not limited and may be variably modified.

A mask 38 having a slit or aperture is disposed between the first lens group 28 and the third mirror 36 in order to block the laser beam from transmitting through an edge portion. A camera 40 may be provided between the second lens group 30 and the substrate 14 in order to allow an operator to monitor the profile of the laser beam.

In the above-described optical system structure, a vibration device 42 may be installed at one of the first, second, and third mirrors 32, 34, and 36 to vibrate the laser beam 20 along the longer-axis direction a1. In particular, the vibration device 42 may be installed at the third mirror 36 positioned next to the homogenizer array 26 that is sensitive to the laser beam path among the first, second, and third mirrors 32, 34, and 36.

Figure 5:
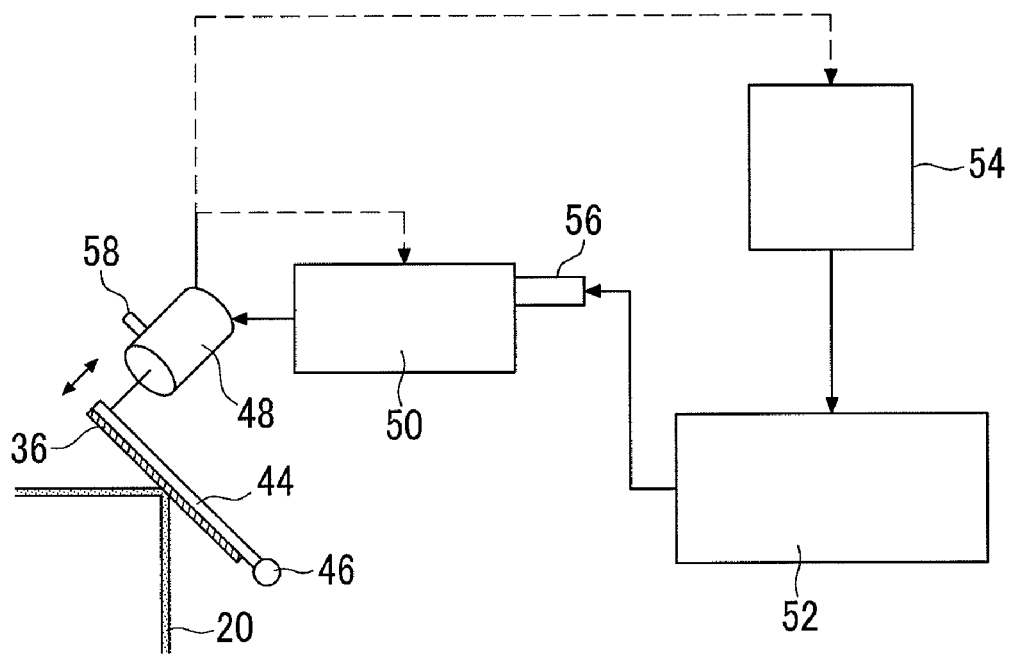
FIG. 5 illustrates an enlarged view of a portion "A" in FIG. 3.

FIG. 5 illustrates an enlarged view of the portion "A" in FIG. 3, showing the third mirror 36 and the vibration device. With reference to FIG. 5, the third mirror 36 is fixed to a support 44, and a fixing shaft 46 is installed at one end of the support 44. The third mirror 36 can be rotated around a center of the fixing shaft 46.

The vibration device 42 may include a vibration operator 48 fixed to the other end of the support 44 to reciprocally move the end of the third mirror 36, a controller 50 including a driver for driving the vibration operator 48, a pulse generator 52 generating a drive signal of the vibration operator 48, and a vibration frequency controller 54 controlling the drive signal generated by the pulse generator 52. A precise motor suitable for a driving of a small displacement, e.g. such as a piezo motor, may be used as the vibration operator 48.

The drive signal generated by the pulse generator 52 is input to the controller 50 and the vibration operator 48 is driven by the driver of the controller 50. The vibration frequency controller 54 generates a vibration frequency of the drive signal generated from the pulse generator 52 according to certain conditions, and the pulse generator 52 generates the drive signal according to the vibration frequency generated by the vibration frequency controller 54. That is, the vibration frequency controller 54 may modulate the amplitude and period of the drive signal generated by the pulse generator 52 such that both meet certain conditions or may modulate one of the amplitude and the period.

A filter 56 may be mounted to prevent generation of an abnormal pulse caused by a change in the vibration frequency and resultant damage to the vibration operator 48. A sensor 58 may be selectively installed at the vibration operator 48 or at the support 44 in order to observe the movement of the vibration operator 48, or feedback controlling may be performed on the controller 50 and the vibration frequency controller 54 by using a signal generated from the sensor 48.

In generating the vibration frequency as mentioned above, as an example, the frequency may be randomly changed at every certain time period based on a center frequency, and the variation of the vibration frequency may be determined to have a certain range based on the center frequency.

Various conditions for generating the vibration frequency of the drive signal generated by the pulse generator 52 and a detailed method thereof will now be described.

Figure 6:
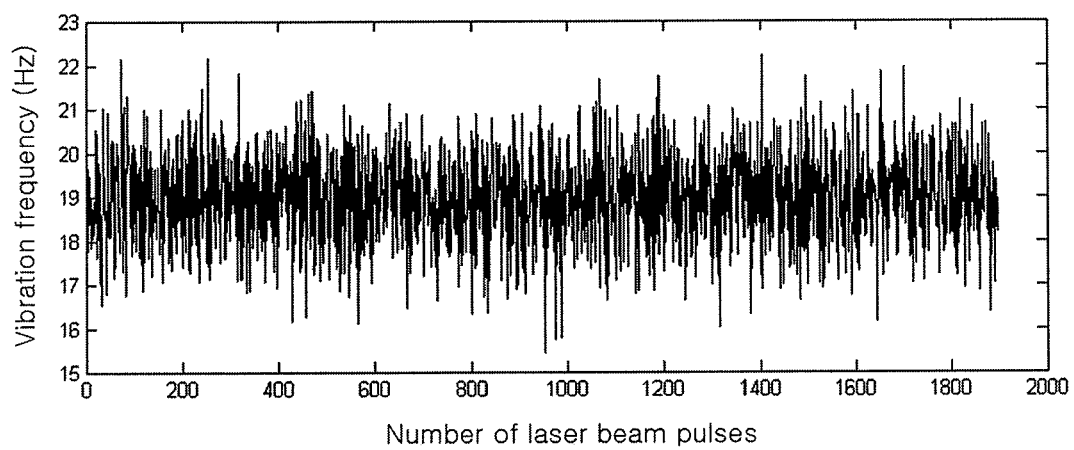
FIG. 6 illustrates a graph showing one example of vibration frequencies over the number of pulses of a laser beam in the silicon crystallization system according to an exemplary embodiment.
Figure 7:
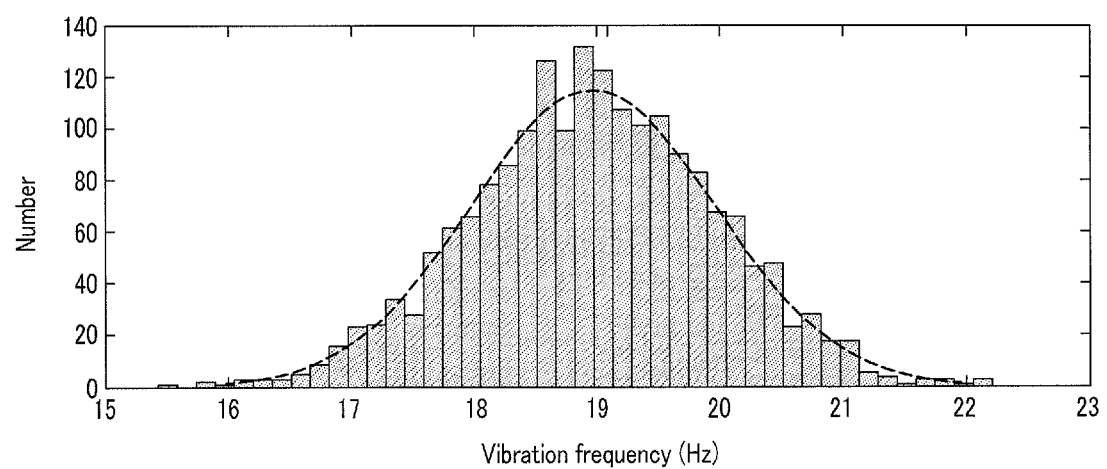
FIG. 7 illustrates a graph showing the distribution of vibration frequencies illustrated in FIG. 6.
Figure 8:
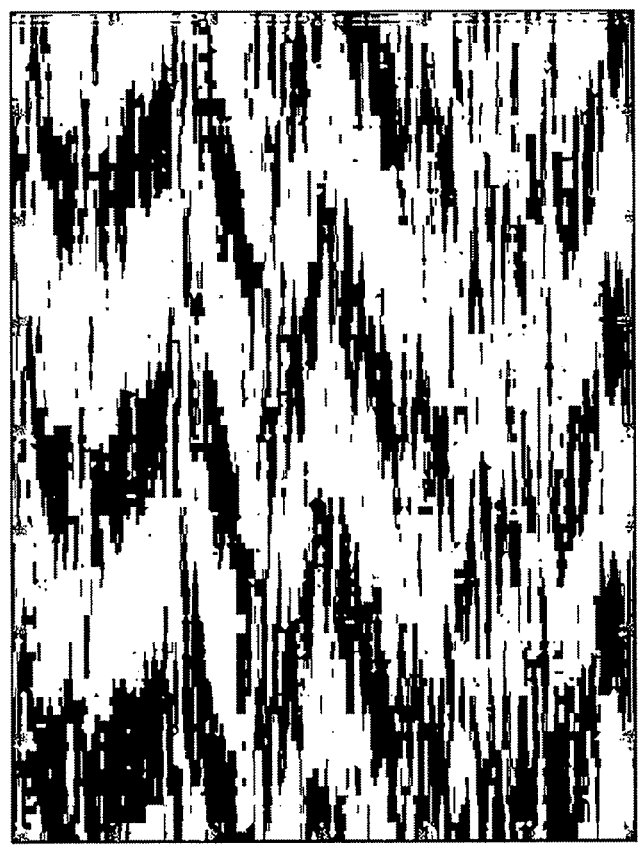
FIG. 8 illustrates a test image of a display device including a polycrystalline silicon thin film obtained by using the crystallization system using the vibration frequency of FIGS. 6 and 7.
Figure 9:
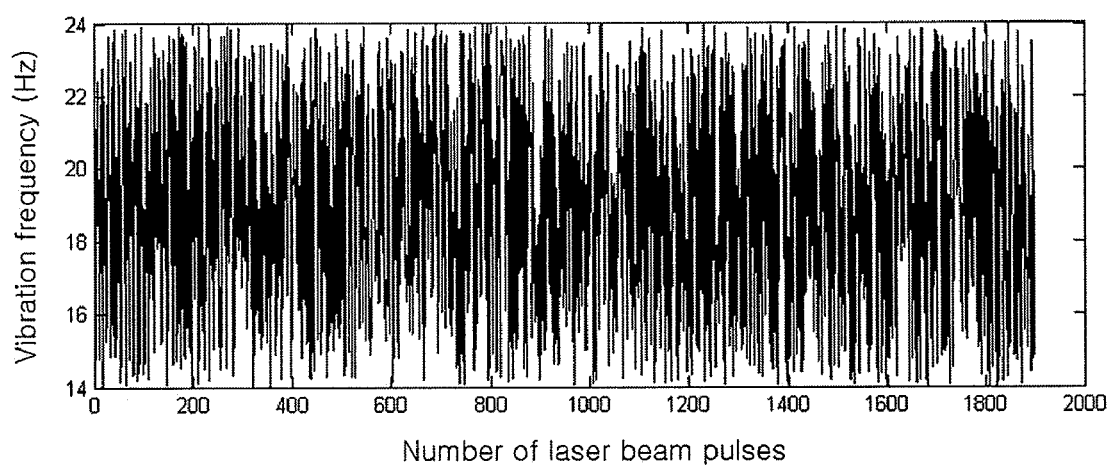
FIG. 9 illustrates a graph showing another example of vibration frequencies over the number of pulses of a laser beam in the silicon crystallization system according to an exemplary embodiment.
Figure 10:
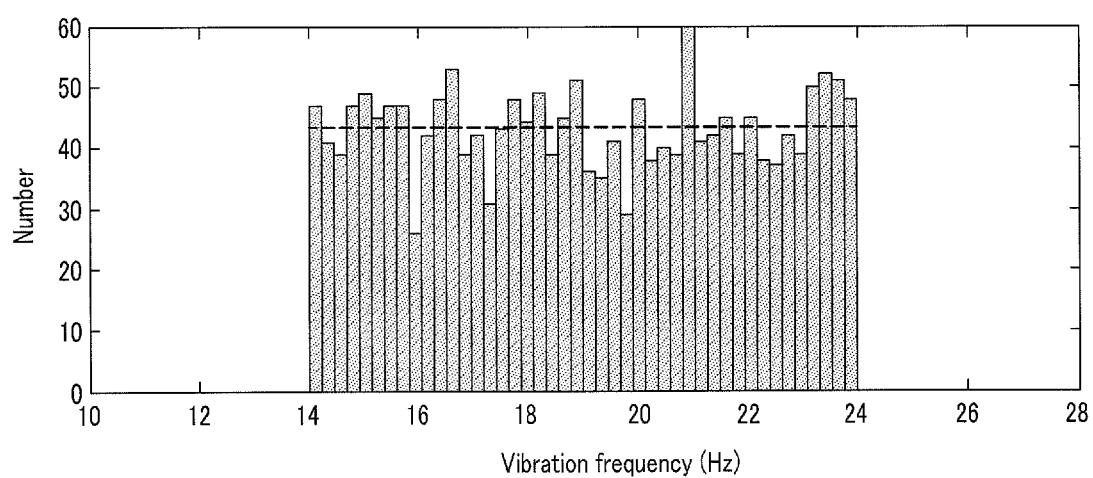
FIG. 10 illustrates a graph showing the distribution of vibration frequencies illustrated in FIG. 9.
Figure 11:
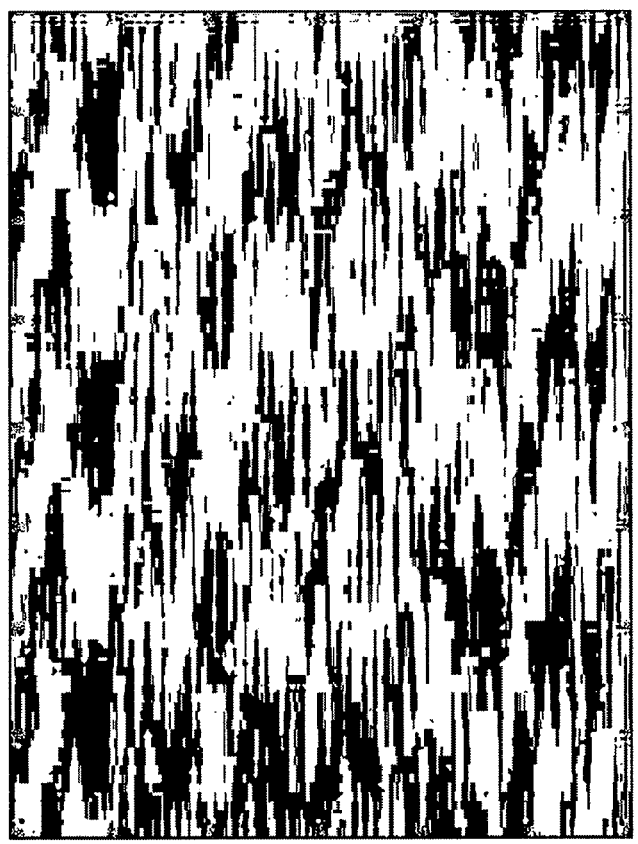
FIG. 11 illustrates a test image of a display device including a polycrystalline silicon thin film obtained by using the crystallization system using the vibration frequency of FIGS. 9 and 10.
Figure 12:
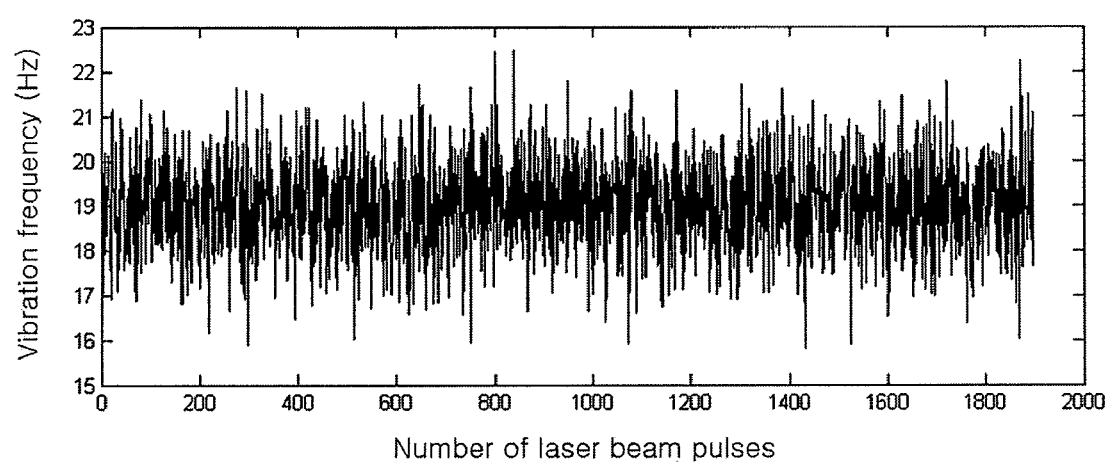
FIG. 12 illustrates a graph showing still another example of vibration frequencies over the number of pulses of a laser beam in the silicon crystallization system according to an exemplary embodiment.
Figure 13:
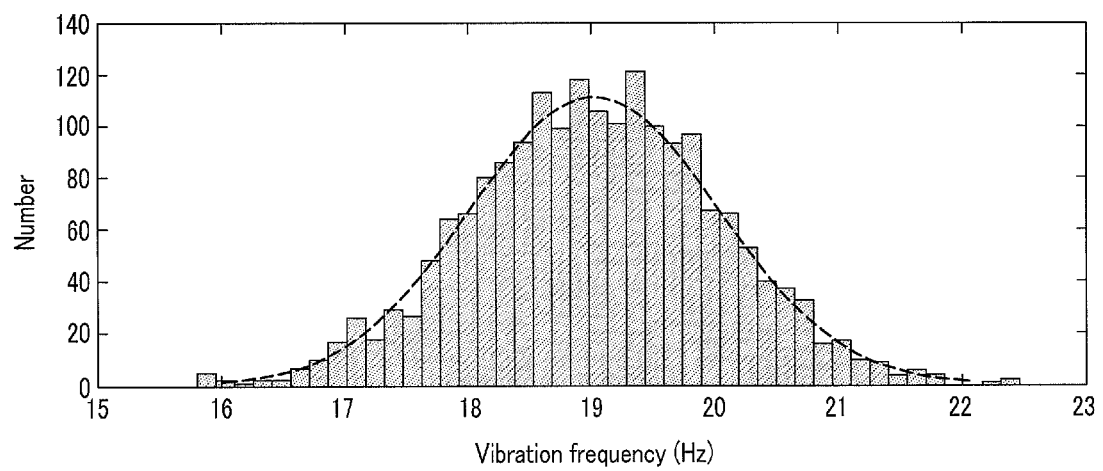
FIG. 13 illustrates a graph showing the distribution of vibration frequencies illustrated in FIG. 12.
Figure 14:
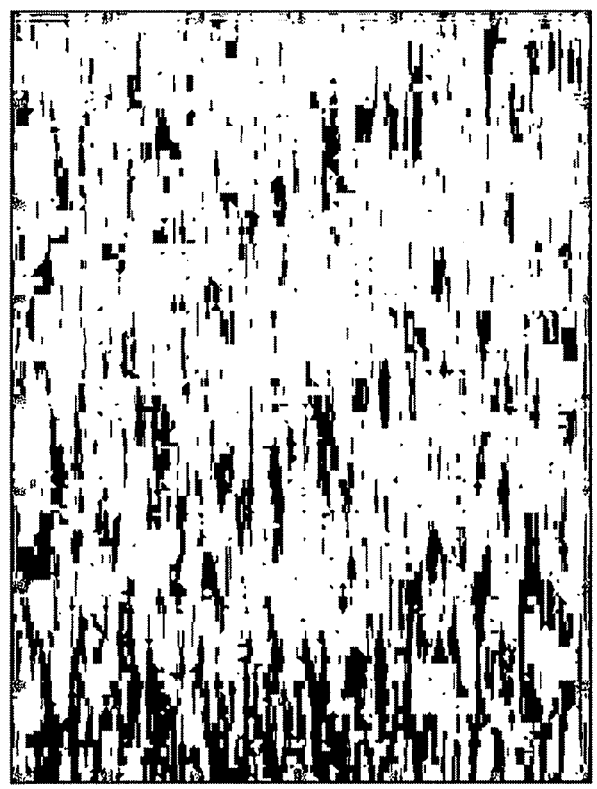
FIG. 14 illustrates a test image of a display device including a polycrystalline silicon thin film obtained by using the crystallization system using the vibration frequency of FIGS. 12 and 13.

FIGS. 6, 9, and 12 illustrate graphs showing examples of vibration frequencies over a number of pulses of a laser beam in the silicon crystallization system according to an exemplary embodiment. FIGS. 7, 10, and 13 illustrate distributions of the vibration frequencies of FIGS. 6, 9, and 12. FIGS. 8, 11, and 14 illustrate test images of a display device including a polycrystalline silicon thin film obtained by using the silicon crystallization system using the vibration frequencies of FIGS. 6, 9, and 12.

First, with reference to FIGS. 6 and 7, the vibration frequency of the drive signal generated by the pulse generator 52 may be generated with a Gaussian distribution within a certain variation width centering around a center frequency. FIG. 7 shows an example in which the vibration frequency is generated within a variation width of 14 Hz to 24 Hz. In this example, the center frequency is about 19 Hz.

The vibration frequency may be newly randomly generated each time with a particular period within a predetermined variation width. The period by which the vibration frequency is generated may be longer than the period of the laser beam shot. For example, when the laser beam is scanned at the frequency of 225 Hz, the frequency at which the vibration frequency changes may be 25 Hz or the like, which is smaller than 225 Hz. The particular period by which the vibration frequency is generated may be randomly changed, rather than being regular.

In generating the vibration frequency, a next vibration frequency may be generated in consideration of an immediately previous vibration frequency. In particular, the next vibration frequency may be generated such that it is not too close to the immediately previous vibration frequency. For example, the difference between the immediately previous vibration frequency and the next vibration frequency may be 2 Hz or greater. In other words, the next vibration frequency may be randomly changed within the predetermined variation width as long as the difference is at least some minimal amount, e.g., about 2 Hz.

The vibration operator 48 vibrates with the vibration frequency randomly generated within the predetermined variation width by the particular period. When the third mirror 36 vibrates accordingly, the laser beam 20 also vibrates with the vibration frequency randomly changing by the particular period along the longer-axis direction a1. As a result, the silicon crystallization system 100 according to the present exemplary embodiment can prevent generation of periodic patterns on the display device including the polycrystalline silicon thin film, and an example of a test image is illustrated in FIG. 8.

With reference to FIG. 8, because periodic patterns that may appear when the laser beam regularly vibrates with a certain vibration frequency along the longer-axis direction are reduced, periodic stripe pattern blurs can be reduced and thus the visibility of the blurs to the observer's eyes can be also reduced.

A method for randomly generating a vibration frequency according to another exemplary embodiment will now be described with reference to FIGS. 9 and 10.

In the present exemplary embodiment, the vibration frequency of the driver signal generated from the pulse generator 52 may be uniformly distributed within a certain variation width centering around a center frequency. FIG. 10 shows an example in which the vibration frequency changes within a variation width of 14 Hz to 24 Hz, and in this case, the center frequency is about 19 Hz. As shown in FIG. 10, the vibration frequency is uniformly distributed overall without being inclined to a particular frequency.

The vibration frequency may be newly randomly generated each time with a particular period within a predetermined variation width, and in this case, the period by which the vibration frequency is generated may be longer than the period of the laser beam pulse. For example, when laser beam is scanned at the frequency of 225 Hz, the frequency at which the vibration frequency changes may be 25 Hz or the like, which is smaller than 225 Hz. The particular period by which the vibration frequency is generated may be randomly changed, rather than being regular.

In generating the vibration frequency, a next vibration frequency may be generated in consideration of an immediately previous vibration frequency. In particular, the next vibration frequency may be generated such that it is not too close to the immediately previous vibration frequency. For example, the difference between the immediately previous vibration frequency and the next vibration frequency may be 2 Hz or greater.

Thus, the vibration operator 48 vibrates with the vibration frequency that randomly changes within the predetermined variation width by a particular period and is uniformly distributed overall. Then, the third mirror 36 vibrates accordingly, and the laser beam 20 also vibrates with the generated vibration frequency along the longer-axis direction a1. As a result, a generation of periodic patterns on the display device fabricated by using the vibration frequency generated according to the present exemplary embodiment can be prevented, and stripe pattern blurs can be also reduced. An example of a test image is illustrated in FIG. 9.

With reference to FIG. 11, because periodic patterns that may appear when the laser beam regularly vibrates with a certain vibration frequency along the longer-axis direction are reduced and the periodic stripe pattern blurs as in the former exemplary embodiment are reduced, the visibility of the blurs to the observer's eyes can be further reduced.

A method for randomly generating a vibration frequency according to still another exemplary embodiment will now be described with reference to FIGS. 12 and 13.

In the present exemplary embodiment, a vibration frequency of a drive signal generated by the pulse generator 52 may be generated with a Gaussian distribution within a certain variation width centering on a center frequency. FIG. 13 shows an example in which the vibration frequency changes within a variation width of 14 Hz to 24 Hz, and in this example, the center frequency is about 19 Hz.

The vibration frequency may be newly randomly generated each time with a particular period within a predetermined variation width, and in this case, the period by which the vibration frequency is generated may be the same as the period of the laser beam pulse. For example, when the laser beam is scanned at the frequency of 225 Hz, the frequency at which the vibration frequency changes may also be the same. That is, a new vibration frequency may be generated for every laser pulse.

In generating the vibration frequency, a next vibration frequency may be generated in consideration of an immediately previous vibration frequency. In particular, the next vibration frequency may be generated such that it is not too close to the immediately previous vibration frequency. For example, the difference between the immediately previous vibration frequency and the next vibration frequency may be 2 Hz or greater.

Thus, the vibration operator 48 vibrates with the vibration frequency that is generated for every laser pulse and changes randomly within the predetermined variation width. Then, the third mirror 36 vibrates accordingly, and the laser beam 20 also vibrates along the longer-axis direction a1. As a result, generation of periodic patterns on the display device fabricated by using the vibration frequency generated according to the present exemplary embodiment can be prevented, and the breadth of stripe pattern blurs can become wider and weaker. An example of a test image is illustrated in FIG. 12.

With reference to FIG. 14, because periodic patterns that may appear when the laser beam regularly vibrates with a certain vibration frequency along the longer-axis direction are reduced and the periodic stripe pattern blurs as in the former exemplary embodiment weaken and their width increases, the visibility of the blurs to the observer's eyes can be further reduced.

Figure 15:
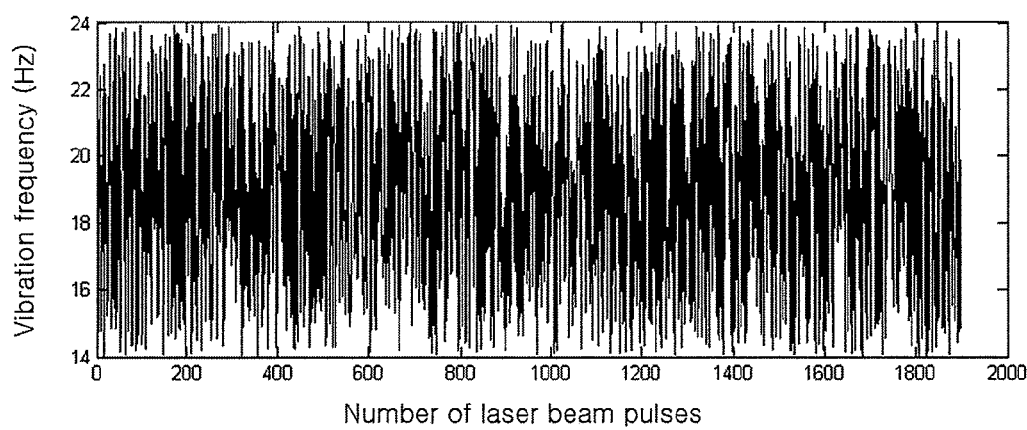
FIG. 15 illustrates a graph showing still yet another example of vibration frequencies over the number of pulses of a laser beam in the silicon crystallization system according to an exemplary embodiment.
Figure 16:
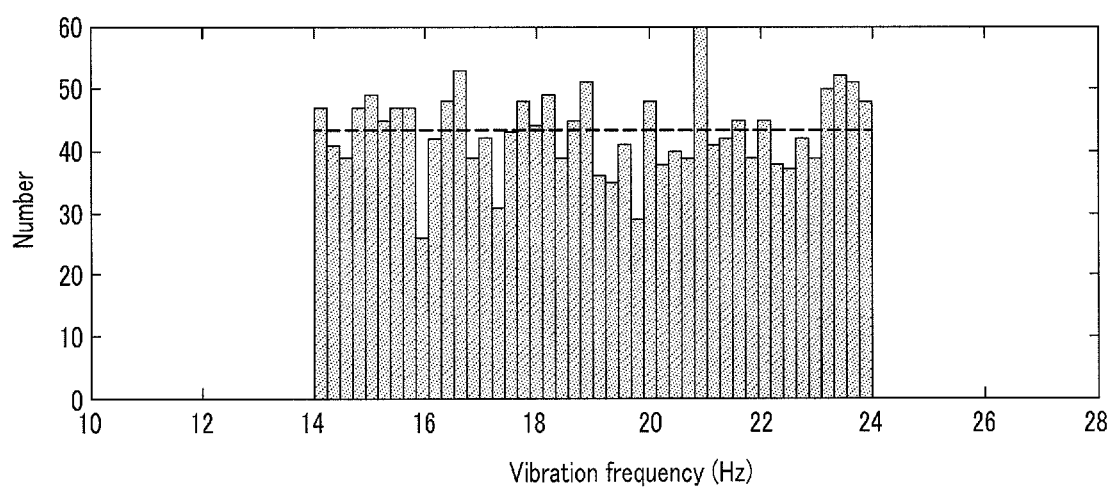
FIG. 16 illustrates a graph showing the distribution of vibration frequencies illustrated in FIG. 15.

A method for randomly modulating a vibration frequency according to yet another exemplary embodiment will now be described with reference to FIGS. 15 and 16.

In the present exemplary embodiment, a vibration frequency of a drive signal generated by the pulse generator 52 may be generated to be substantially uniformly distributed within a certain variation width centering on a center frequency. FIG. 16 shows an example in which the vibration frequency changes within a variation width of 14 Hz to 24 Hz, and in this example, the center frequency is about 19 Hz. As shown in FIG. 16, the vibration frequency is uniformly distributed overall without being inclined to a particular frequency.

The vibration frequency may be newly randomly generated each time with a particular period within a predetermined variation width, and in this case, the period by which the vibration frequency is generated may be the same as the period of the laser beam pulse. For example, when laser beam is scanned at the frequency of 225 Hz, the frequency at which the vibration frequency changes may also be the same. That is, a new vibration frequency is generated for every laser pulse.

In modulating the vibration frequency, a next vibration frequency may be generated in consideration of an immediately previous vibration frequency. In particular, the next vibration frequency may be generated such that it is not too close to the immediately previous vibration frequency. For example, the difference between the immediately previous vibration frequency and the next vibration frequency may be 2 Hz or greater.

Thus, the vibration operator 48 vibrates with the vibration frequency that is generated for every laser pulse, randomly changes within the predetermined variation width, and is uniformly distributed overall. Then, the third mirror 36 vibrates accordingly, and the laser beam 20 also vibrates with the generated vibration frequency along the longer-axis direction a1. As a result, a generation of periodic patterns on the display device fabricated by using the vibration frequency generated according to the present exemplary embodiment can be prevented, and stripe pattern blurs can be minimized. An example of a test image is illustrated in FIG. 17.

Figure 17:
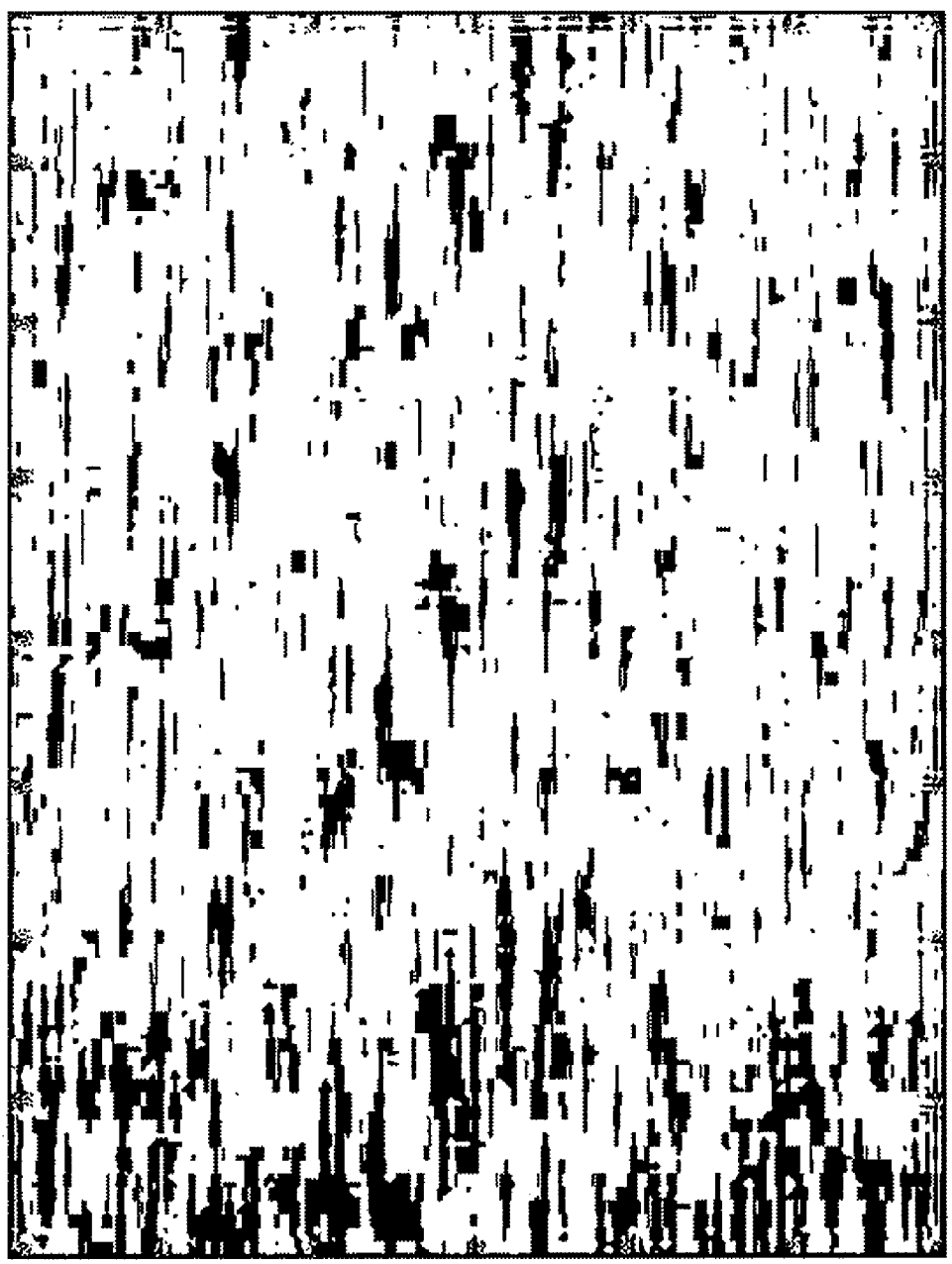
FIG. 17 illustrates a test image of a display device including a polycrystalline silicon thin film obtained by using the crystallization system using the vibration frequency of FIGS. 15 and 16.

With reference to FIG. 17, it is noted that the stripe pattern blurs appearing in the former exemplary embodiment become so weak so as to not be seen. Thus, such stripe pattern blurs almost disappear from an image of the display device, improving the display characteristics.

In this manner, when the laser beam vibrates in the longer-axis direction, the vibration frequency can be randomly generated for every laser beam pulse while being distributed within a certain variation width, and thus, stripe pattern blurs in various directions can be reduced. Also, because a next vibration frequency is generated to not be too close to an immediately previous frequency with reference to the already generated frequency, vibration frequencies can be more randomly generated and the display characteristics of the display device can be enhanced.

In the above description, the vibration frequencies of the drive signals are randomly generated, but in this case, the amplitude of the drive signals can also be randomly modulated.

In addition, the vibration frequencies of the drive signals can be randomly generated non-periodically regardless of the various certain conditions as mentioned above, by which a non-uniform energy distribution of a laser beam can be distributed to obtain a uniform energy distribution of the laser beam.

Hereinafter, a silicon crystallization system according to a second exemplary embodiment of the present invention will now be described with reference to FIGS. 18 to 20. In the present exemplary embodiment, the same content as that of the first exemplary embodiment will be briefly described or a description thereof will be omitted.

Figure 18:
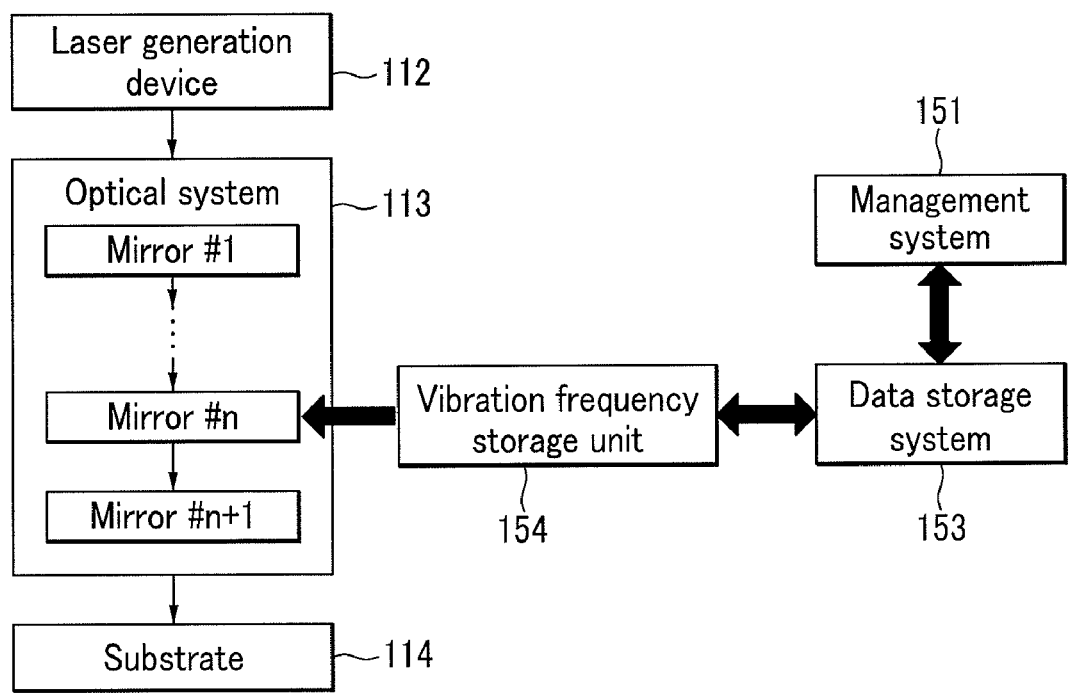
FIG. 18 is a schematic block diagram of a silicon crystallization system according to a second exemplary embodiment of the present invention.
Figure 19:
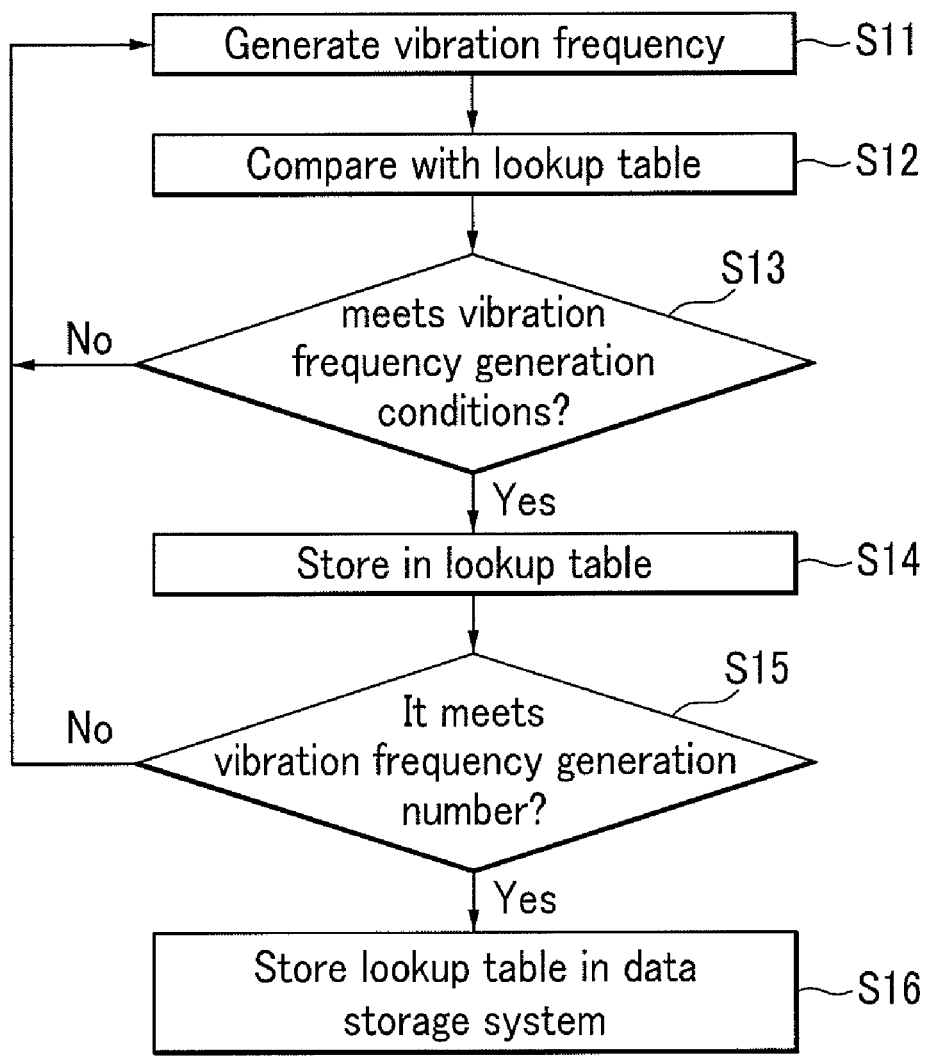
FIG. 19 is a flowchart illustrating the process of generating a vibration frequency of a laser beam according to the second exemplary embodiment of the present invention.

FIG. 18 is a schematic block diagram of a silicon crystallization system according to a second exemplary embodiment of the present invention, and FIG. 19 is a flowchart illustrating the process of generating a vibration frequency of a laser beam according to the second exemplary embodiment of the present invention.

With reference to FIG. 18, a silicon crystallization system according to the present exemplary embodiment includes a laser generation device 112, an optical system 113, a substrate 114, a vibration frequency storage unit 154, a data storage system 153, and a management system 151.

The optical system 113, including a plurality of mirrors #1, . . . , #n+1, changes energy distribution, direction, and the like, of an oscillated laser beam and scans it to the substrate 114.

The vibration frequency storage unit 154 stores a vibration frequency for vibrating the at least one mirror of the optical system 113 and provides the same to a pulse generator (not shown). Also, the data storage system 153 may store the vibration frequency stored in the storage unit 154 and monitor a generated vibration frequency through the management system 151.

In the first exemplary embodiment, the vibration frequency generator of the vibration frequency controller generates a vibration frequency according to conditions and transmits the generated vibration frequency to the pulse generator so that a laser beam is scanned to the mirror of the optical system, and at the same time, the generated vibration frequency is stored in the lookup table. However, according to the first exemplary embodiment, as the process proceeds, a large amount of vibration frequency data is accumulated in the lookup table, and whenever a new vibration frequency is generated, it must be compared with the vibration frequency data stored in the lookup table, potentially causing input and output of data to be delayed. That is, as a new vibration frequency is generated when a laser beam is scanned, the new vibration frequency may not be generated at a desired period and this may adversely affect the silicon crystallization process.

Thus, in the present exemplary embodiment, unlike the first exemplary embodiment, a vibration frequency is previously generated before the process of scanning a laser beam. That is, a set of randomly changing vibration frequencies are previously generated and used in the process of scanning the laser beam, thereby securing randomness of the vibration frequencies and restraining process delay.

With reference to FIG. 19, in the present exemplary embodiment, first, a vibration frequency is generated according to certain conditions (step S11) and compared with generation conditions stored in the lookup table (step S12) to determine whether or not the generated vibration frequency fits the vibration frequency generation conditions (step S13). When the generated vibration frequency fits the vibration frequency generation conditions stored in the lookup table, it is stored in the lookup table (step S14), and otherwise, the process returns to the vibration frequency generation step S11.

After the vibration frequency is stored in the lookup table (step S14), it is determined whether or not the number of vibration frequencies stored in the lookup table meets the pre-set number of generated vibration frequencies (step S15). When the number of vibration frequencies stored in the lookup table is smaller than the pre-set number of generated vibration frequencies, the process returns to the vibration frequency generation step S11 and the foregoing steps are repeatedly performed. When the number of vibration frequencies stored in the lookup table meets the pre-set number of generated vibration frequencies, the lookup table may be stored in the data storage system 153 and transmitted to the management system 151. That is, in the present exemplary embodiment, the vibration frequency controller 54 of the first exemplary embodiment is replaced by the vibration frequency storage unit 154.

Through this process, a set of randomly changing vibration frequencies may be generated and stored, and provided from the vibration frequency storage unit 154 to the pulse generator in order to scan a laser beam of which vibration frequency changes randomly.

The vibration frequency generation conditions stored in the lookup table are the same as those in the first exemplary embodiment. That is, in the present exemplary embodiment, the vibration frequencies may be generated according to the vibration frequency generation conditions as described above with reference to FIGS. 6 to 17.

Further, in the present exemplary embodiment, in the sequential process of generating vibration frequencies, the number of vibration frequencies included in one vibration frequency set is previously set, and in this case, the number of vibration frequencies to be included in one vibration frequency set may be determined according to whether or not laser beams are scanned by cells, mother substrates, or lots. Alternatively, the vibration frequency set may be previously generated at certain time intervals in consideration of transfer speed of the substrate.

When the vibration frequency set is set by cell, the number of vibration frequencies included in one vibration frequency set may be set to be $$\frac{\text{Cell width}}{\text{Scan interval of laser beam}}$$

or smaller.

In this case, the cell width refers to the width in a direction in which the substrate is transferred to scan laser beams, that is, in the direction of a2 in FIG. 4.

When a laser beam is scanned to one cell, laser shots by the amount obtained by dividing the cell width by a scan interval are required. Thus, in a case in which a new vibration frequency is set for every laser shot as shown in FIGS. 12 and 15, the number of vibration frequencies included in a vibration frequency set for crystallizing a cell is equal to a value of $$\frac{\text{Cell width}}{\text{Scan interval of laser beam}},$$

and when the vibration frequency generation period is greater than the laser shot period as shown in FIGS. 6 to 9, the number of vibration frequencies included in a vibration frequency set is set to be smaller than the value of $$\frac{\text{Cell width}}{\text{Scan interval of laser beam}}.$$

A cell is a unit that is smaller than a mother substrate and a lot (to be described), and when the vibration frequency set is set by cell, randomness can be definitely secured compared with the case in which the vibration frequency set is set by mother substrate or lot.

When a vibration frequency set is set by mother substrate, the number of vibration frequencies included in one vibration frequency set may be set to be $$\frac{\text{Width of mother substrate}}{\text{Scan interval of laser beam}}$$

or smaller. In this case, the width of the mother substrate refers to a width in the direction in which the substrate is transferred to scan laser beams, that is, a width in the direction of a2 in FIG. 4.

When laser beams are scanned to one mother substrate, laser shots of an amount obtained by dividing the width of the mother substrate by a scan interval are required. Thus, when a new vibration frequency is set for every laser shot as shown in FIGS. 12 and 15, the number of vibration frequencies to be included in a vibration frequency set for crystallizing one mother substrate is equal to a value of $$\frac{\text{Width of mother substrate}}{\text{Scan interval of laser beam}},$$

and when the vibration frequency generation period is greater than the laser shot period as shown in FIGS. 6 and 9, the number of vibration frequencies to be included in one vibration frequency set is set to be smaller than the value of $$\frac{\text{Width of mother substrate}}{\text{Scan interval of laser beam}}.$$

Meanwhile, when the length of the longer-axis direction of the laser beam, that is, the length in the a1 direction in FIG. 4, is smaller than the length in the direction perpendicular to the width of the mother substrate, that is, the length in the a1 direction in FIG. 4, the number of vibration frequencies to be generated is set in consideration of this. For example, when the length in the direction perpendicular to the width of the mother substrate is double the length in the longer-axis direction of the laser beam and a new vibration frequency is set for every laser shot, the number of vibration frequencies to be included in one vibration frequency is set to be double the value of $$\frac{\text{Width of mother substrate}}{\text{Scan interval of laser beam}}.$$

One mother substrate includes a plurality of cells. When a vibration frequency set is set by cell, the vibration frequency set must be newly set whenever the size of the cell is changed, causing inconvenience, but when a vibration frequency set is set by mother substrate, such inconvenience can be eliminated.

When a vibration frequency set is set by lot, the number of vibration frequencies to be included in one vibration frequency set may be set as a value obtained by multiplying the number of vibration frequencies in the case in which the vibration frequency set is set by mother substrate as set in the above description by the number of mother substrates included in one lot. One lot includes a plurality of mother substrates, and when a vibration frequency set is set by lot, the inconvenience of newly setting the vibration frequency set according to a change in the size of a cell can be eliminated.

Meanwhile, a vibration frequency set may be set at certain time intervals. In this case, the number of vibration frequencies included in one vibration frequency set is $$\frac{\text{(transfer speed of substrate)} \times \text{(set time)}}{\text{Scan interval of laser beam}}$$

or smaller. Here, because the transfer speed of the substrate is calculated as (frequency of laser beam)×(scan interval of laser beam), the number of vibration frequencies included in one vibration frequency set is (frequency of laser beam)×(set time) or smaller. In this case, the set time may be set in consideration of the size of a cell, a mother substrate, or a lot.

As described above, when the number of vibration frequencies included in one vibration frequency set is determined, a vibration frequency set is previously set according to the flowchart in FIG. 19, and a crystallization process is performed by using the pre-set vibration frequency set, whereby a process delay can be prevented and perfect randomness can be secured.

Figure 20:
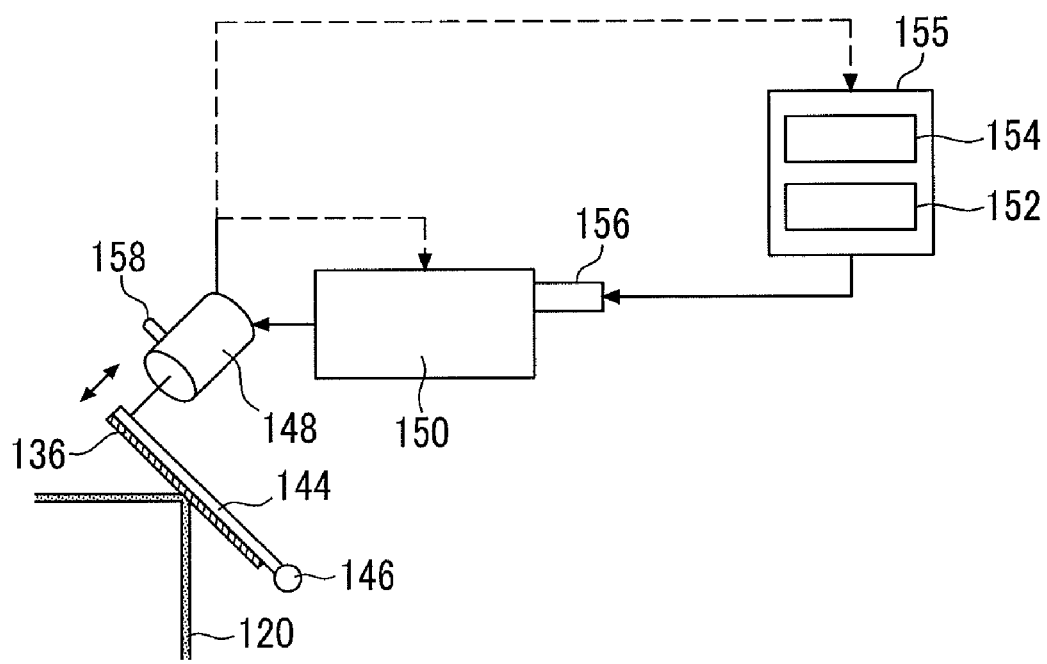
FIG. 20 is a view schematically showing a vibration device of a silicon crystallization system according to a modification of the second exemplary embodiment of the present invention.

FIG. 20 is a view schematically showing a vibration device of a silicon crystallization system according to a modification of the second exemplary embodiment of the present invention. A vibration device 142 according to this modification has a similar structure to that of the vibration device 42 according to the first and second exemplary embodiments.

A third mirror 136 is fixed to a support 144 and a fixing shaft 146 is installed at an end of the support 144. Accordingly, the third mirror 135 may rotate based on the fixing shaft 146. The vibration device 142 includes a vibration operator 146 fixed to the opposite end of the support 144 and reciprocally moving the end of the third mirror 136, a controller 150 including a driver for driving the vibration operator 148, a pulse generator 152 generating a drive signal of the vibration operator 148, and a vibration frequency controller 155 controlling the drive signal generated by the pulse generator 152. In this case, a precise operator suitable for the driving of a small displacement such as a piezo-operator may be used as the vibration operator 148.

In this modification, the vibration frequency controller 155 includes a vibration frequency storage unit 154 and a pulse generator 152. The pulse generator 152 periodically receives vibration frequencies of the vibration frequency set stored in the vibration frequency storage unit 154 and generates corresponding drive signals. The generated drive signals are inputted to the controller 150, and the vibration operator 148 is driven by the driver of the controller 150.

A filter 156 may be mounted in the controller 150 in order to prevent an abnormal pulse caused by a change in a vibration frequency and damage to the vibration operator 148 due to the abnormal pulse. In addition, a sensor 158 may be selectively installed at the vibration operator 148 or the support 144. The movement of the vibration operator 148 may be observed through the sensor 158.

Meanwhile, in the present exemplary embodiment and the modification, the vibration frequency of a drive signal is randomly generated, but the amplitude of the drive signal can also be randomly modulated together.

Because the set of randomly changing vibration frequencies is previously set and a crystallization process is performed by using the vibration frequency set, a process delay can be prevented and perfect randomness can be secured.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A silicon crystallization system, comprising:
a vibration device configured to vibrate a linear laser beam in a longer-axis direction of the linear laser beam, the vibration device configured to periodically generate and randomly change a vibration frequency, within a predetermined range, at which the laser beam is vibrated, wherein a difference between a newly generated vibration frequency of the linear laser beam in a longer-axis direction and an immediately previous vibration frequency of the linear laser beam in a longer-axis direction that has already been generated is greater than 2 Hz.

2. The system as claimed in claim 1, wherein a generation period of the vibration frequency is the same as a pulse period of the laser beam.

3. The system as claimed in claim 1, wherein a generation period of the vibration frequency is longer than a pulse period of the laser beam.

4. The system as claimed in claim 1, wherein the vibration frequency has a uniform distribution.

5. The system as claimed in claim 4, wherein the newly generated vibration frequency is not the same as the immediately previous vibration frequency that has been already generated.

6. The system as claimed in claim 1, wherein the vibration frequency has a Gaussian distribution.

7. The system as claimed in claim 6, wherein the newly generated vibration frequency is not the same as the immediately previous vibration frequency that has been already generated.

8. The system as claimed in claim 1, further comprising an optical system comprising a mirror that changes the energy distribution of the laser beam and the path of the laser beam.

9. The system as claimed in claim 8, wherein the vibration device vibrates the mirror.

10. The system as claimed in claim 9, wherein the vibration device comprises:
a vibration operator reciprocally moving an end of the mirror;
a controller comprising a driver for driving the vibration operator;
a pulse generator generating a drive signal of the vibration operator; and
a vibration frequency controller generating a vibration frequency of the drive signal.

11. The system as claimed in claim 10, wherein the vibration frequency controller randomly modulates the amplitude of the drive signal.

12. The system as claimed in claim 1, wherein the vibration frequency is previously set as one vibration frequency set having a plurality of randomly changing values.

13. The system as claimed in claim 12, wherein the number of vibration frequencies included in the pre-set vibration frequency set is $$\frac{\text{Cell width}}{\text{Scan interval of laser beam}}$$

or smaller.

14. The system as claimed in claim 12, wherein the number of vibration frequencies included in the pre-set vibration frequency set is $$\frac{\text{Width of mother substrate}}{\text{Scan interval of laser beam}}$$

or smaller.

15. The system as claimed in claim 12, wherein the number of vibration frequencies included in the pre-set vibration frequency set is $$\frac{(\text{Number of mother substrates included in one lot}) \times (\text{Width of mother substrate})}{\text{Scan interval of laser beam}}$$

or smaller.

16. The system as claimed in 12, further comprising:
an optical system,
wherein the optical system comprises a mirror that changes an energy distribution of the laser beam and the path of the laser beam.

17. The system as claimed in claim 16, wherein the vibration device vibrates the mirror.

18. The system as claimed in claim 16, wherein the optical system comprises a homogenizer array for forming the linear shape of the laser beam, and a plurality of lens groups.

19. The system as claimed in 18, wherein the vibration device comprises a vibration operator reciprocally moving an end of the mirror, a controller comprising a driver for driving the vibration operator, a pulse generator generating a drive signal of the vibration operator, and a vibration frequency storage unit storing the vibration frequency included in the drive signal.

20. The system as claimed in 19, wherein the amplitude of the drive signal is previously set as a randomly changing value in the vibration frequency storage unit.

21. A silicon crystallization method, comprising:
preparing a substrate with an amorphous silicon thin film formed thereon; and
irradiating a linear laser beam onto the amorphous silicon thin film to form polycrystalline silicon, irradiating including vibrating the laser beam in a longer-axis direction at a vibration frequency that is periodically generated and randomly changed within a predetermined range, wherein a difference between a newly generated vibration frequency of the linear laser beam in a longer-axis direction and an immediately previous vibration frequency of the linear laser beam in a longer-axis direction that has already been generated is greater than 2 Hz.

22. The method as claimed in claim 21, wherein a generation period of the vibration frequency is the same as a pulse period of the laser beam.

23. The method as claimed in claim 21, wherein a generation period of the vibration frequency is longer than a pulse period of the laser beam.

24. The method as claimed in claim 21, wherein the vibration frequency has a uniform distribution.

25. The method as claimed in claim 21, wherein the vibration frequency has a Gaussian distribution.

26. The method of claim 21, wherein the vibration frequency is previously set as one vibration frequency set having a plurality of randomly changing values and stored in a vibration frequency storage unit, and the vibration frequency storage unit transfers the pre-set vibration frequency set to the optical system.

27. The method as claimed in claim 26, wherein the number of vibration frequencies included in the pre-set vibration frequency set is $$\frac{\text{Cell width}}{\text{Scan interval of laser beam}}$$

or smaller.

28. The method as claimed in claim 26, wherein the number of vibration frequencies included in the pre-set vibration frequency set is $$\frac{\text{Width of mother substrate}}{\text{Scan interval of laser beam}}$$

or smaller.

29. The method as claimed in claim 26, wherein the number of vibration frequencies included in the pre-set vibration frequency set is $$\frac{(\text{Number of mother substrates included in one lot}) \times (\text{Width of mother substrate})}{\text{Scan interval of laser beam}}$$

or smaller.

* * * * *